(12) United States Patent
Koukoumidis et al.

(10) Patent No.: US 10,642,366 B2
(45) Date of Patent: May 5, 2020

(54) PROXIMITY SENSOR-BASED INTERACTIONS

(71) Applicant: Microsoft Technology Licensing, LLC, Redmond, WA (US)

(72) Inventors: Emmanouil Koukoumidis, Bellevue, WA (US); Brian Beckman, Newcastle, WA (US); Sumit Kumar, Bellevue, WA (US); Konstantinos Aisopos, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/483,480

(22) Filed: Apr. 10, 2017

(65) Prior Publication Data

US 2017/0212600 A1 Jul. 27, 2017

Related U.S. Application Data

(63) Continuation of application No. 14/197,213, filed on Mar. 4, 2014, now Pat. No. 9,652,044.

(51) Int. Cl.
*G06F 3/01* (2006.01)
*G06F 3/0346* (2013.01)
(Continued)

(52) U.S. Cl.
CPC ............ *G06F 3/017* (2013.01); *A63F 13/21* (2014.09); *A63F 13/42* (2014.09); *G06F 3/0346* (2013.01);
(Continued)

(58) Field of Classification Search
CPC .................. G06F 3/0425; G06F 3/017; G06F 2203/04108; G06F 2203/04101
(Continued)

(56) References Cited

U.S. PATENT DOCUMENTS 8,054,300 B2 11/2011 Bernstein
8,166,421 B2 4/2012 Magal et al.
(Continued)

FOREIGN PATENT DOCUMENTS

EP 2107443 A2 10/2009
EP 2624116 A1 8/2013

OTHER PUBLICATIONS

"International Preliminary Report on Patentability Issued in PCT Application No. PCT/US2015/017866", dated May 31, 2016, 7 pages.
(Continued)

*Primary Examiner* — Koosha Sharifi-Tafreshi

(74) *Attorney, Agent, or Firm* — Holzer Patel Drennan

(57) ABSTRACT

An application programming interface is provided that allows applications to request and receive distance measurements from multiple proximity sensors arranged on a computing device such as a smart phone or tablet. Users can input ranges of values to the applications by moving objects such as hands and fingers towards and away one or more of the multiple proximity sensors. Applications can use the ranges of values provided by the proximity sensors to allow for more nuanced and precise user interfaces than what is typically available using the binary output associated with a capacitive display. The values provided by the proximity sensors can be combined with values from one or more other sensors such as accelerometers to provide additional user interface options.

15 Claims, 11 Drawing Sheets

(51) Int. Cl.

| | |
|---|---|
| *G06F 3/0488* | (2013.01) |
| *G06F 3/041* | (2006.01) |
| *A63F 13/21* | (2014.01) |
| *A63F 13/42* | (2014.01) |
| *H03K 17/955* | (2006.01) |

(52) U.S. Cl.
CPC .......... *G06F 3/0416* (2013.01); *G06F 3/0488* (2013.01); *A63F 2300/10* (2013.01); *A63F 2300/105* (2013.01); *G06F 2203/04101* (2013.01); *H03K 17/955* (2013.01)

(58) Field of Classification Search
USPC .......... 345/156, 173, 175; 382/103; 715/863
See application file for complete search history.

(56) References Cited

U.S. PATENT DOCUMENTS

| | | | |
|---|---|---|---|
| 8,219,936 | B2 | 7/2012 | Kim et al. |
| 8,432,372 | B2 | 4/2013 | Butler et al. |
| 8,516,397 | B2 | 8/2013 | Frazier et al. |
| 8,643,628 | B1 | 2/2014 | Eriksson et al. |
| 8,819,812 | B1* | 8/2014 | Weber .................... G06F 3/017 726/19 |
| 9,020,194 | B2* | 4/2015 | Gupta .................... G06F 3/0304 382/103 |
| 10,088,924 | B1* | 10/2018 | Ivanchenko .......... G06F 1/1686 |
| 2002/0082079 | A1 | 6/2002 | Mantyjarvi et al. |
| 2003/0132974 | A1* | 7/2003 | Bodin .................... G06F 3/017 715/863 |
| 2007/0119698 | A1 | 5/2007 | Day |
| 2007/0152978 | A1 | 7/2007 | Kocienda et al. |
| 2008/0122798 | A1 | 5/2008 | Koshiyama et al. |
| 2008/0225041 | A1* | 9/2008 | El Dokor ................ G06F 3/011 345/419 |
| 2009/0289914 | A1 | 11/2009 | Cho |
| 2010/0066696 | A1* | 3/2010 | Yang ..................... G06F 1/3231 345/173 |
| 2010/0164479 | A1 | 7/2010 | Alameh et al. |
| 2010/0289740 | A1 | 11/2010 | Kim et al. |
| 2010/0295783 | A1* | 11/2010 | El Dokor ................ G06F 3/017 345/158 |
| 2010/0321289 | A1 | 12/2010 | Kim et al. |
| 2011/0018795 | A1 | 1/2011 | Jang |
| 2011/0131005 | A1 | 6/2011 | Ueshima et al. |
| 2011/0234491 | A1 | 9/2011 | Nurmi |
| 2011/0312349 | A1 | 12/2011 | Forutanpour et al. |
| 2011/0314427 | A1* | 12/2011 | Sundararajan .......... G06F 9/451 715/863 |
| 2012/0005632 | A1* | 1/2012 | Broyles .................. G06F 3/017 715/863 |
| 2012/0120002 | A1 | 5/2012 | Ota |
| 2012/0120029 | A1 | 5/2012 | McCarthy et al. |
| 2012/0229380 | A1 | 9/2012 | Silvester |
| 2012/0280902 | A1 | 11/2012 | Persaud et al. |
| 2013/0050118 | A1* | 2/2013 | Kjelsbak ................ G06F 3/017 345/173 |
| 2013/0100064 | A1 | 4/2013 | Ronkainen |
| 2013/0179784 | A1 | 7/2013 | Bang |
| 2013/0194223 | A1 | 8/2013 | Ward et al. |
| 2013/0211843 | A1* | 8/2013 | Clarkson ................ G06F 3/017 704/275 |
| 2013/0244731 | A1 | 9/2013 | Oishi et al. |
| 2014/0253427 | A1* | 9/2014 | Gruhlke ................. G06F 3/017 345/156 |
| 2014/0368422 | A1* | 12/2014 | Gupta .................... G06F 3/0304 345/156 |
| 2015/0049017 | A1* | 2/2015 | Weber .................... G06F 3/017 345/156 |

OTHER PUBLICATIONS

"Second Written Opinion Issued in PCT Application No. PCT/US2015/017866", dated Feb. 11, 2016, 6 pages.
"International Search Report & Written Opinion Issued in PCT Application No. PCT/US2015/017866", dated May 29, 2015, 10 Pages.
"Restriction Requirement Issued in U.S. Appl. No. 14/197,213", dated Aug. 25, 2015, 6 pages.
"Non-Final Office Action Issued in U.S. Appl. No. 14/197,213", dated Oct. 2, 2015, 23 pages.
"Final Office Action Issued in U.S. Appl. No. 14/197,213", dated Feb. 3, 2016, 30 pages.
"Non-Final Office Action Issued in U.S. Appl. No. 14/197,213", dated Jun. 23, 2016, 27 pages.
"Final Office Action Issued in U.S. Appl. No. 14/197,213", dated Sep. 30, 2016, 38 pages.
"Notice of Allowance Issued in U.S. Appl. No. 14/197,213", dated Jan. 17, 2017, 10 pages.
"Supplemental Notice of Allowability Issued in U.S. Appl. No. 14/197,213", dated Jan. 31, 2017, 7 pages.
"Office Action Issued in European Patent Application No. 15716194.4", dated Sep. 20, 2018, 4 Pages.
"First Office Action and Search Report Issued in Chinese Patent Application No. 201580009804.0", dated Sep. 5, 2018, 12 Pages.
"Second Office Action Issued in Chinese Patent Application No. 201580009804.0", dated May 27, 2019, 9 Pages.
"Office Action Issued in European Patent Application No. 15716194.4", dated Jul. 18, 2019, 6 Pages.

* cited by examiner

PROXIMITY SENSOR-BASED INTERACTIONS

CROSS-REFERENCE TO RELATED APPLICATIONS

This application is a continuation of U.S. application Ser. No. 14/197,213, filed on Mar. 4, 2014, the disclosure of which is hereby incorporated in its entirety.

BACKGROUND

Modern computing devices such as smart phones, laptops, game systems, and tablet computers often include a proximity sensor. A proximity sensor may be capable of detecting the presence of a nearby object as well as an approximate distance between the sensor and the nearby object. Proximity sensors may be implemented using a variety of technologies including lasers, sonar, and ultrasound, for example.

While proximity sensors are often capable of measuring the distance between the sensor and a nearby object, the proximity sensors found in most computing devices are often limited by the operating system or programming interface to only determining whether or not an object is close to the proximity sensor. Applications that use the proximity sensor in this way include applications that disable a display when it is determined that the computing device is against an ear, or applications that increase a ring volume of the computing device when it is determined that the device may be in a pocket, for example.

SUMMARY

An application programming interface is provided that allows applications to request and receive distance measurements from multiple proximity sensors arranged on a computing device such as a smart phone or tablet. Users can input ranges of values to the applications by moving objects such as hands and fingers towards and away one or more of the multiple proximity sensors. Applications can use the ranges of values provided by the proximity sensors to allow for more nuanced and precise user interfaces than what is typically available using the binary output associated with a capacitive display. The values provided by the proximity sensors can be combined with values from one or more other sensors such as accelerometers to provide additional user interface options.

In an implementation, a first value is received from a first proximity sensor by an application of a computing device. The first value represents a first distance between a first object and the first proximity sensor. A second value is received from a second proximity sensor by the application of the computing device. The second value represents a second distance between a second object and the second proximity sensor. One or more operations are performed based on both the first value and the second value by the application of the computing device.

In an implementation, a first sequence of input values is received from a first proximity sensor and a second proximity sensor by a computing device. Each input value in the first sequence of input values represents either a distance between a first object and the first proximity sensor or a distance between a second object and the second proximity sensor. The first sequence is associated with one or more operations by the computing device. A second sequence of input values is received from the first proximity sensor and the second proximity sensor by the computing device. That the second sequence matches the first sequence is determined by the computing device. In response to the determination, one or more operations associated with the first sequence is performed by the computing device.

In an implementation, a first sequence of input values is received from a first proximity sensor by a computing device. Each input value in the first sequence of input values represents a distance between a first object and the first proximity sensor. The first sequence is associated with one or more operations by the computing device. A second sequence of input values is received from the first proximity sensor by the computing device. That the second sequence matches the first sequence is determined by the computing device. In response to the determination, one or more operations associated with the first sequence is performed by the computing device.

This summary is provided to introduce a selection of concepts in a simplified form that are further described below in the detailed description. This summary is not intended to identify key features or essential features of the claimed subject matter, nor is it intended to be used to limit the scope of the claimed subject matter.

BRIEF DESCRIPTION OF THE DRAWINGS

The foregoing summary, as well as the following detailed description of illustrative embodiments, is better understood when read in conjunction with the appended drawings. For the purpose of illustrating the embodiments, there is shown in the drawings example constructions of the embodiments; however, the embodiments are not limited to the specific methods and instrumentalities disclosed. In the drawings.

DETAILED DESCRIPTION

Figure 1:
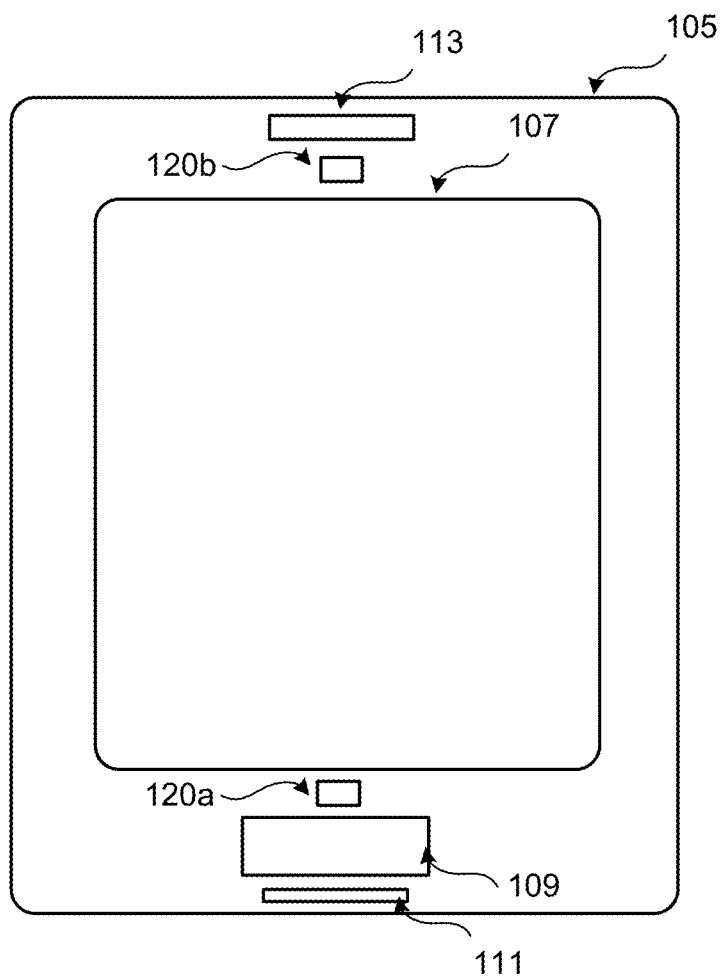
FIG. 1 is an illustration of an example computing device.

FIG. 1 is an illustration of an example computing device 100. In the example shown, the computing device 100 includes a display 107 integrated into a housing 105. The display 107 may comprise a capacitive display, and may be used by a user to provide user input to the computing device 100. The computing device 100 may also include one or more hardware inputs (e.g., buttons or switches) that may also be used to provide user input to the computing device 100. In the example shown, the computing device 100 is a smart phone, and may also include a speaker 113 and a microphone 111. The computing device 100 is illustrated in more detail by the example computing device 1100 shown in FIG. 11. While described as a smart phone, the computing device 100 is not limited to smart phones and may also be implemented as one or more of a laptop, tablet computer, portable videogame system, and portable media player, for example.

The computing device 100 also comprises proximity sensors 120a and 120b (collectively referred to herein as proximity sensors 120). Each proximity sensor 120 may be capable of determining a distance between the proximity sensor 120 and a nearby object. The proximity sensors 120 may be implemented using a variety of techniques including lasers, sonar, and ultrasound, for example. Depending on the implementation, an application or operating system associated with the computing device 100 may query a proximity sensor 120 for a measurement of a distance between the proximity sensor 120 and a closest object. The proximity sensor 120 may return the measured distance. Depending on the type and capabilities of the proximity sensor 120, the distance may be provided in a variety of formats and/or resolutions including feet, inches, centimeters, millimeters, micrometers, nanometers, etc.

Figure 2:
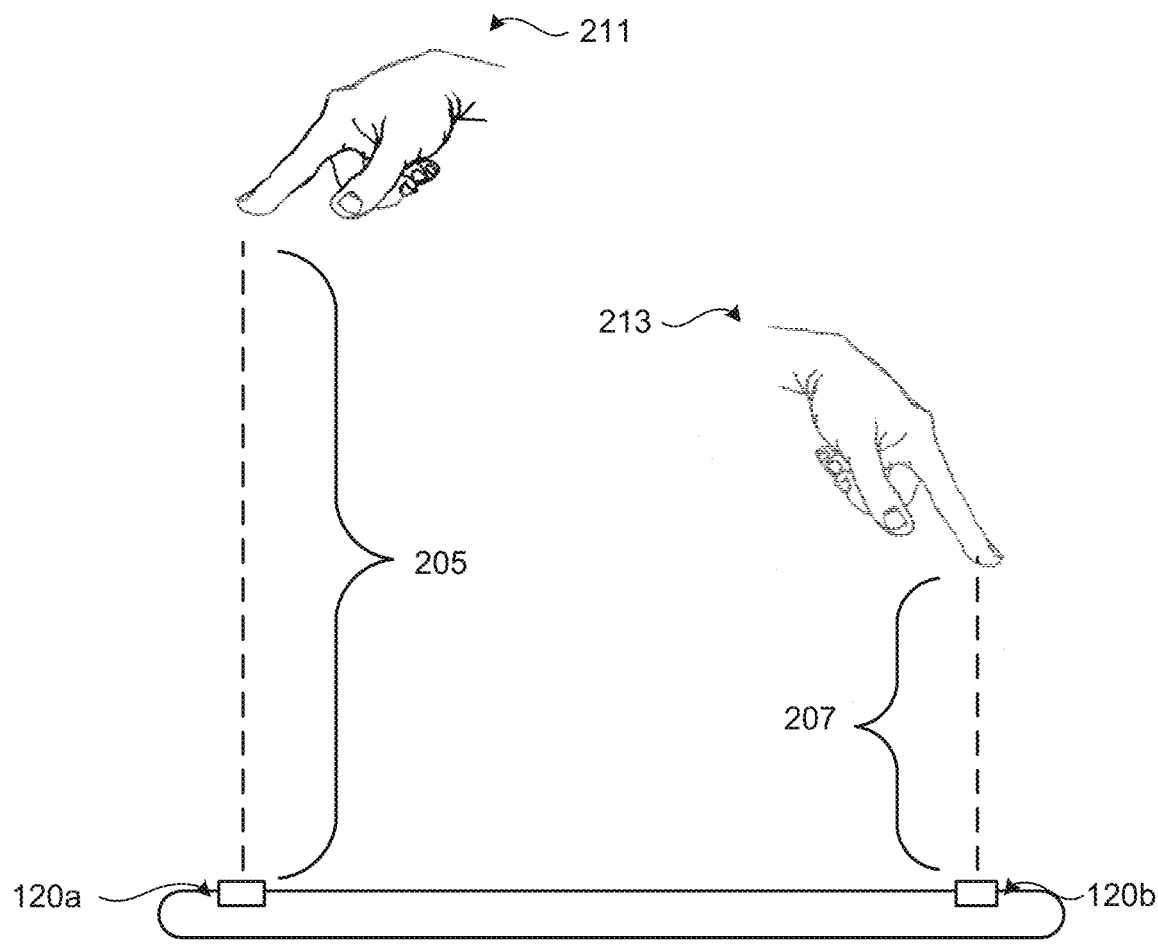
FIG. 2 is an illustration of a user or users interacting with the proximity sensors.

For example, FIG. 2 is an illustration of a user or users interacting with the proximity sensors. In the example shown, an object 211 and an object 213 (i.e., hands) are in front of the proximity sensors 120a and 120b, respectively. The proximity sensor 120a measures a distance 205 between the object 211 and the proximity sensor 120a, and provides the measured distance 205 to one or more applications associated with the computing device 100. Similarly, the proximity sensor 120b measures a distance 207 between the object 213 and the proximity sensor 120b, and provides the measured distance 207 to the one or more applications. As the user or users move either the objects 211 and 213, or the computing device 100, the proximity sensors 120a and 120b may update the values of the distances 205 and/or 207 provided to the one or more applications.

In addition to the distance, a proximity sensor 120 may be used to measure a velocity of an object that is in front of the proximity sensor 120. For example, the proximity sensor 120b may determine the velocity of the object 213 by comparing a current measured distance and time with a previously measured distance at a previous time. The measured velocity may be provided to the one or more applications.

As may be appreciated, the proximity sensors 120 may be used to provide a variety of user interface implementations to the operating system and/or applications executing on the computing device 100. In particular, the proximity sensors 120 may be used in applications and/or interfaces where a range of input values may be useful, as opposed to the binary on/off type of input values associated with capacitive displays. In addition, many of the user interface implementations described herein may be provided using existing proximity sensors 120 of current mobile devices without the addition of new or expensive sensors.

One such implementation is for videogame applications. Currently, most videogame applications use the capacitive display 107 to receive user input through displayed buttons. These capacitive displays typically cannot distinguish between a hard press of a displayed button and a soft press of a displayed button. To facilitate a greater range of user input, a videogame application may use the proximity sensors 120 to receive user input. The distance provided by the proximity sensors 120 may be used to as an indicator of the relative strength of the user input.

For example, a racing videogame application may map the proximity sensor 120a to a "gas pedal" of a racecar, and may map the proximity sensor 120b to a "brake pedal". When a hand or finger of a user is detected near the proximity sensor 120a, the videogame may actuate the gas pedal of the racecar with a force that is inversely proportional to the distance between the finger and the proximity sensor 120a. Accordingly, the smaller the distance between the proximity sensor 120a and the finger, the faster the racecar will accelerate. The brake pedal associated with the proximity sensor 120b may operate similarly.

In another example, a fighting videogame application may map the proximity sensor 120a to a "punch", and may map the proximity sensor 120b to a "kick". When a user moves his hand or finger with respect to a proximity sensor 120, the application may make a character punch or kick with a velocity that is proportional to the velocity detected by the associated proximity sensor 120.

In another example, a board game videogame application may map each of the proximity sensors 120 to a player of the board game. For example, where a computing device has four proximity sensors 120, each user may use his assigned proximity sensor 120 to control the velocity of a virtual dice roll, where the velocity measured by the proximity sensor 120 is translated into a velocity of the virtual dice roll in the board game. In another example, the board game may be a "hungry-hungry hippos" type game where the velocity measured by a proximity sensor 120 is used to control the speed and reach of a corresponding hippo.

In addition, the proximity sensors 120 may be used in conjunction with other sensors of the computing device 100 such as an accelerometer, a global positioning system, a gyroscope, and the capacitive display 107. Other sensors may be used. For example, continuing the fighting videogame application above, the application may use the proximity sensors 120 to measure the velocity of the user's finger as it approaches the computing device 100, but may not register the punch or kick selection until the accelerometer or display 107 indicates that the computing device 100 has been touched by the user. After determining that the computing device 100 has been touched, the application may cause the punch or kick to be performed with a force proportional to the determined velocity.

In another example, the accelerometer may be used to distinguish between movements of the computing device 100 and movements of hands and/or fingers with respect to the proximity sensors 120. If movement of the computing device 100 is detected by the accelerometer, then any changes of distances measured by the proximity sensors 120 may be disregarded or adjusted to account for the movement. For example, a user may have been inadvertently jostled, or may be riding on a train or bus, which may result in an inadvertent change in distance between one or more of the proximity sensors 120.

In another example application, the proximity sensors 120 may be used to record a sequence of distance changes. For example, a user may move both hands towards and away from each of the proximity sensors 120 and the sequence may be recorded. The sequences may include changes in distances as well as changes in velocity. The user may associate one or more actions or operations with the recorded sequence such as unlocking the computing device 100, opening an application, or calling a contact, for example. At a later time when the user repeats the sequence, the computing device 100 may perform the one or more operations.

As may be appreciated, the proximity sensors 120 described herein can be used in any application where multiple degrees of input sensitivity may be incorporated. For example, in a painting or drawing application the measured velocities or distances can be used to adjust an amount or pressure applied by an on-screen pencil or brush. In a mapping application, the measured distance or velocity can be used to control a zoom level or speed. In an email or text viewing application, the measured distance or velocity can be used to control a scroll speed. Other applications can be supported.

Returning to FIG. 1, as illustrated the proximity sensors 120a and 120b are located at approximately opposite locations in the housing 105 of the computing device 100 next to the button 109 and the speaker 113, respectively. Where only two proximity sensors 120 are used, such an arrangement may allow for easy use of the multiple proximity sensors 120 when the computing device 100 is held in either of the two possible landscape orientations. However, other proximity sensor 120 configurations are contemplated and illustrated, for example, with respect to the computing devices 300, 400, and 500 illustrated in FIGS. 3, 4, and 5, respectively.

Figure 3:
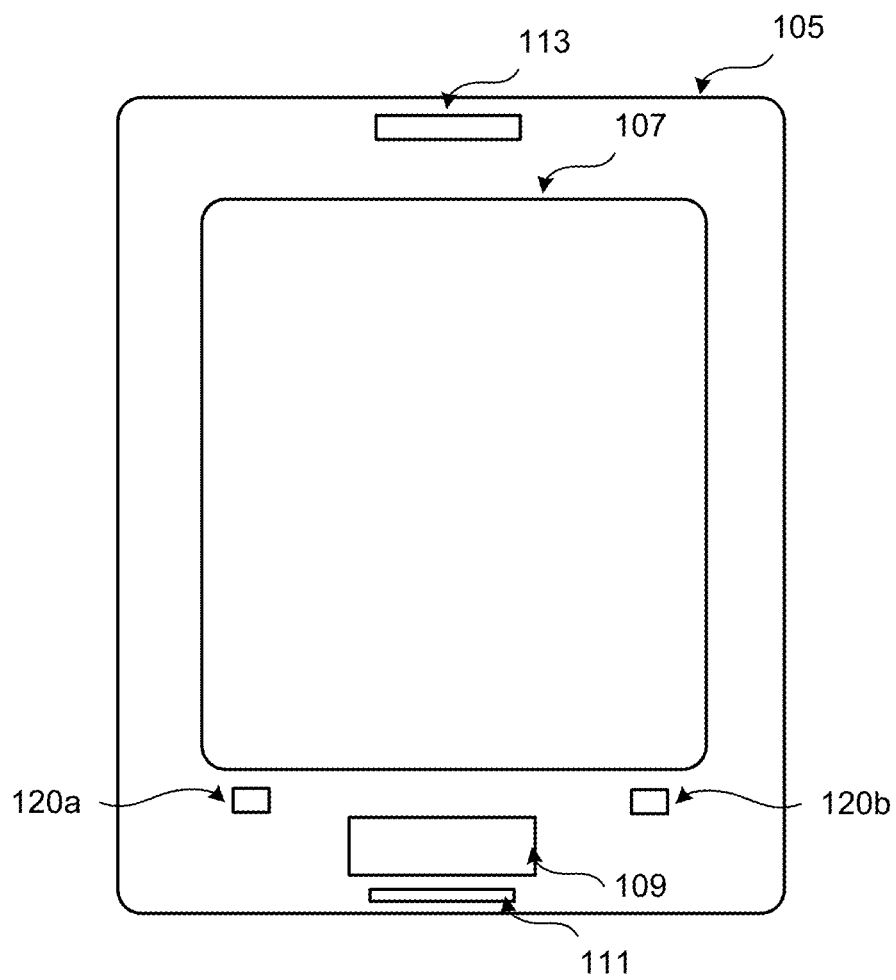
FIG. 3 is an illustration of another example computing device.

As shown in FIG. 3, for the computing device 300, the proximity sensors 120a and 120b are placed on opposite sides of the button 109 and the microphone 111 on the lower portion of the housing 105. In this configuration, the proximity sensors 120 may be well placed for use when the computing device 300 is held in one of the two possible portrait orientations. For the other possible portrait orientation, the proximity sensors 120a and 120b would be placed at the top of the housing 105 on either side of the speaker 113.

Figure 4:
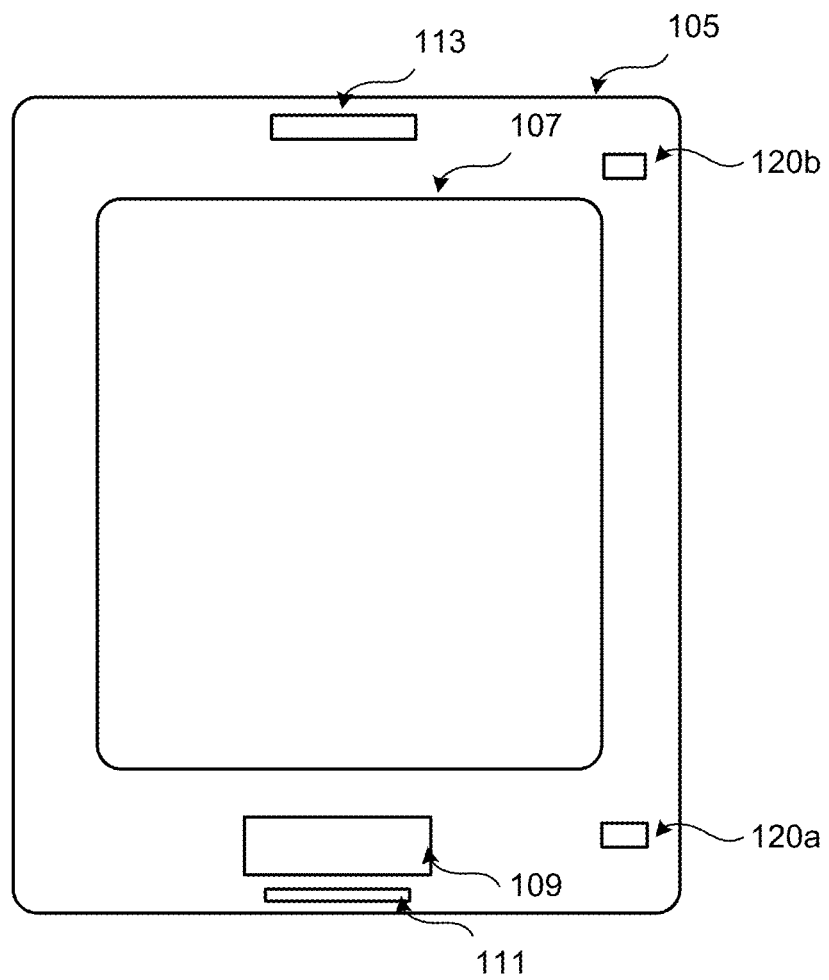
FIG. 4 is an illustration of another example computing device.

In contrast, as shown in FIG. 4, for the computing device 400, the proximity sensors 120a and 120b have been placed in the upper right hand corner and lower right corner of the housing 105. In this configuration, the proximity sensors 120 may be well placed for use when the computing device 400 is held in one of the two possible landscape orientations. For the other possible landscape orientation, the proximity sensors 120a and 120b may be placed the opposite sides of the housing 105.

Figure 5:
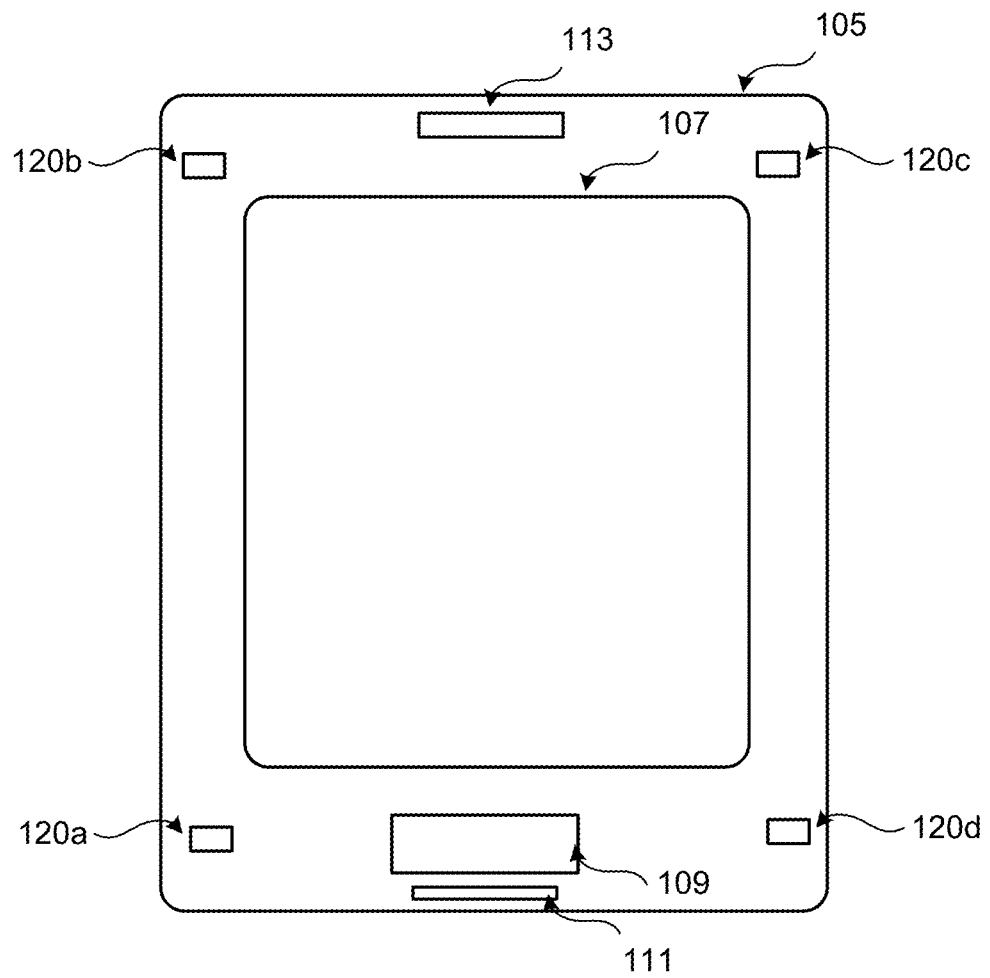
FIG. 5 is an illustration of another example computing device.

In another implementation, rather than two proximity sensors 120a and 120b, three or more proximity sensors 120 may be used to allow for a greater number of orientations to be supported. For example, FIG. 5 shows the computing device 500 with four proximity sensors 120 (i.e., proximity sensor 120a, 120b, 120c, and 120d). In such a configuration, some or all of the proximity sensors 120 may be used allowing the computing device 500 to be held in any of the four orientations. The computing device 500 may selectively activate or deactivate one or more of the proximity sensors 120a-d depending on the orientation of the computing device 500. Alternatively, each of the proximity sensors 120a-d may be used allowing up to four independent proximity based inputs.

For example, in some implementations, an application may detect the orientation of the computing device 500 using a gyroscope, accelerometer, or other orientation detection means. If the computing device 500 is held in the portrait mode with the proximity sensors 120a and 120d closest to the user, then the proximity sensors 120a and 120d may be activated and the proximity sensors 120b and 120c may be deactivated. If the computing device 500 is held in the portrait mode with the proximity sensors 120b and 120c closest to the user, then the proximity sensors 120b and 120c may be activated and the proximity sensors 120a and 120d may be deactivated. If the computing device 500 is held in the landscape mode with the proximity sensors 120b and 120a closest to the user, then the proximity sensors 120b and 120a may be activated and the proximity sensors 120c and 120d may be deactivated. If the computing device 500 is held in the landscape mode with the proximity sensors 120c and 120d closest to the user, then the proximity sensors 120c and 120d may be activated and the proximity sensors 120b and 120a may be deactivated.

In another implementation, the computing device 500 may selectively activate or deactivate proximity sensors 120 based on user settings. The user may select the proximity sensors 120 to use for all application on the computing device 500, or may select proximity sensors 120 for each application separately. For example, a user may select proximity sensors 120a and 120b when using a fighting videogame application and proximity sensors 120c and 120d when using a racing videogame application.

In another example, the proximity sensors 120 may be activated dynamically based on the distance values measured by the proximity sensors when a particular application is started, or after prompting a user. The proximity sensors 120 with the smallest measured distances may then be activated. For example, when a user starts an application on the computing device 500, the user may be prompted to select one or more proximity sensors 120 by placing a finger over the desired proximity sensors 120. When the application requests a distance measurement from each of the proximity sensors 120, the proximity sensors 120 that the user has selected by placing a finger over them will measure a very close or small distance. The application may activate proximity sensors 120 with the smallest measured distances.

While only up to four proximity sensors 120 are shown in the FIGS. 1-5 is it for illustrative purposes only; there is no limit to the number of proximity sensors 120 that may be supported. Moreover, the placements and locations of the proximity sensors 120 are not limited to those shown in the drawings. Other placements are contemplated including placements on the rear and sides of the computing devices, and behind the display 107.

Figure 6:
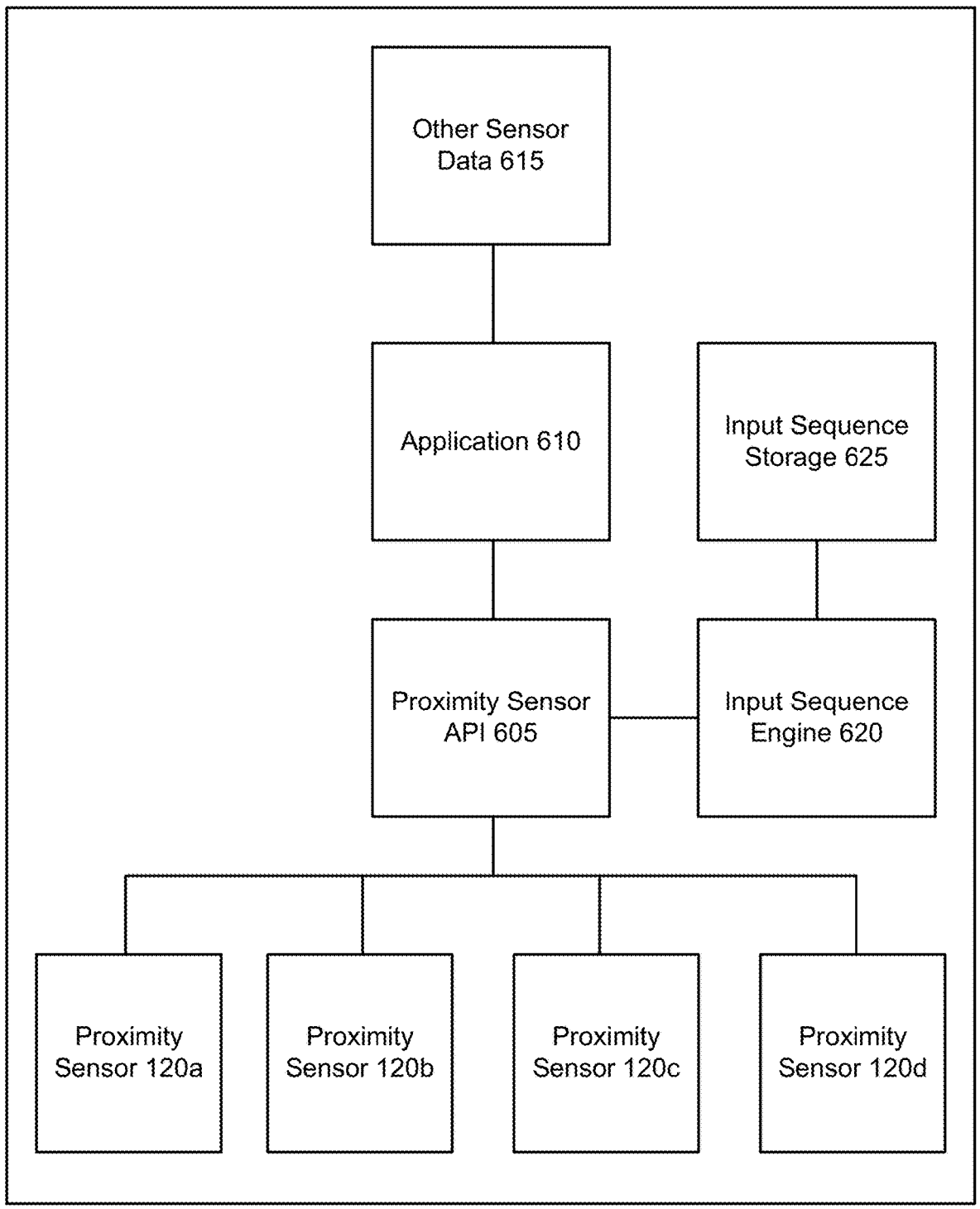
FIG. 6 is an illustration of an environment where the proximity sensors may be implemented.

FIG. 6 is an illustration of an environment 600 where the proximity sensors 120 may be implemented. The environment may be implemented by the computing device 1100 described with respect to FIG. 11. The environment 600 may include one or more components including an application 610, a proximity sensor API 605, an input sequence engine 620, and one or more proximity sensors 120.

The application 610 may include any type of application that may interact with a proximity sensor 120. The applications may include videogame applications, media creating applications, mapping applications, web browsers, and other types of applications. Applications typically associated with the operating system such as launchers, keyboards, lock screens, and dialers may also be supported. There is no limit to the number of applications 610 that may be part of the environment 600.

The proximity sensor API 605 may be an application programming interface that allows the application 610 to access or use the proximity sensors 120. In some implementations, the proximity sensor API 605 may be a set of functions that allow the application 610 to determine a distance of the nearest object to each proximity sensor 120 as well as a velocity of the nearest object. Alternatively, the application 610 may calculate the velocity of the object using a sequence of distance measurements. The API 605 may allow the application 610 to interact with a variety of proximity sensor 120 types using a common set of functions.

The input sequence engine 620 may record or store a representation of a sequence of inputs from the proximity sensors 120. The input sequences may include values such as distances and/or velocities measured by one or more of the proximity sensors 120 over some period of time. Each input sequence may be associated with one or more operations such as unlocking the computing device, calling a contact, or launching a particular application 610. Each input sequence may be stored by the input sequence engine 620 in an input sequence storage 625. When an input sequence is received that matches one of the stored input sequences, the one or more operations associated with the matching input sequence may be performed by the input sequence engine 620.

In some implementations, each input sequence may be associated with a particular length of time. When the user wants to create a new input sequence, the input sequence engine 620 may use the proximity sensor API 605 to record the distances and/or velocities measured by one or more of the proximity sensors 120 over the length of time as the user interacts with one or more of the proximity sensors 120. The interactions may include the user moving his hands or fingers towards and away from the proximity sensors 120 at varying velocities. After the length of time has expired, the input sequence engine 620 may ask the user to repeat the interactions associated with the input sequence in order to verify that they were correctly recorded.

If verified, the input sequence engine 620 may ask the user to select one or more operations to associate with the input sequence. The input sequence and indicators of the selected one or more operations may be stored by the input sequence engine 620 in the input sequence storage 625.

Alternatively, the input sequences may be limited to some number of distance changes rather than limited to a particular length of time. For example, the input sequence may include two, three, four, or five distance changes with respect to one or more of the proximity sensors 120. In some implementations, the input sequence engine 620 may ask the user to select a desired sequence length, and then successively prompt the user to position his hand or finger at each desired distance in the sequence.

Where multiple proximity sensors 120 are used, the input sequence engine 620 may allow the user to change between proximity sensors 120 during the sequence or to use multiple proximity sensors 120 simultaneously during the sequence. Thus, an example sequence may be the user holding one finger above the proximity sensor 120a at a distance of 2 cm, the user holding fingers above both the proximity sensors 120a and 120b at a distance of 4 cm, the user holding one finger above the proximity sensor 120b at a distance of 2 cm, and the user holding a finger above the proximity sensor 120a at a distance of 2 cm while also holding a finger above the proximity sensor 120b at a distance of 4 cm.

The application 610 and/or the input sequence engine 620 may also use other sensor data 615. The other sensor data 615 may include data from other sensors associated with the computing device 1100 including, but not limited to, an accelerometer, global positioning system, a gyroscope, thermometer, barometer, altimeter, accelerometer, and a capacitive touch screen. Other types of sensor data may be supported.

With respect to the application 610, the sensor data 615 may be used alongside the distance and/or velocity data from the proximity sensors 120. For example, in implementations with multiple proximity sensors 120 some or all of the proximity sensors 120 may be enabled or disabled based on a detected orientation.

The accelerometer data of the other sensor data 615 may also be used to distinguish user movement towards the proximity sensors 120 that is caused by movement of the computing device 1100 from actual movement by the user towards the proximity sensors 120, or to determine when the user has touched the computing device 1100.

With respect to the input sequence engine 620, the other sensor data 615 may be included in the recorded input sequences. For example, the user may shake or more the computing device 1100 as part of the input sequence, or may move the computing device 1100 towards his finger rather than move his finger towards a proximity sensor 120. The other sensor data 615 may be stored by the input sequence engine 620 with the input sequences in the input sequence storage 625.

Figure 7:
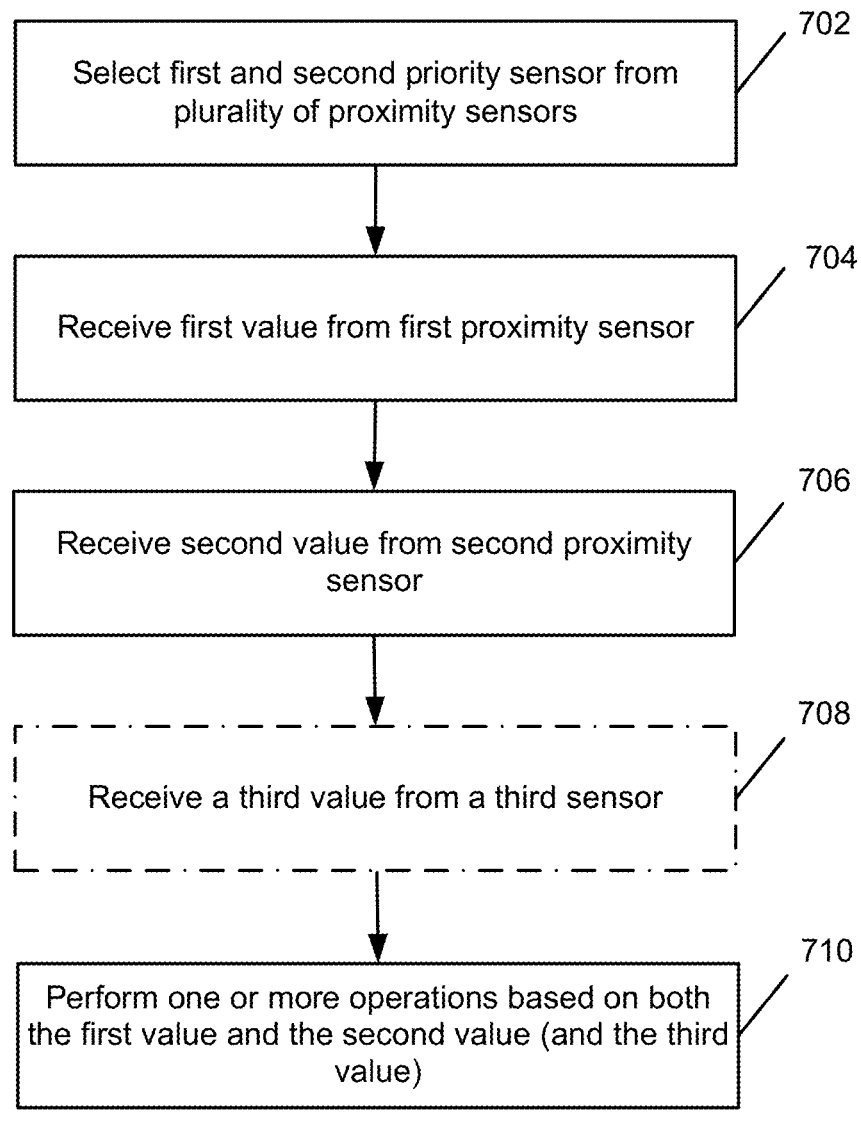
FIG. 7 is an illustration of an implementation of an exemplary method for performing one or more operations based on data from a plurality of proximity sensors.

FIG. 7 is an illustration of an implementation of an exemplary method 700 for performing one or more operations based on data from a plurality of proximity sensors 120. The method 700 may be implemented by the computing device 1100. The computing device 1100 may comprise a smart phone, laptop, or tablet computer, for example.

A first proximity sensor and a second proximity sensor are selected at 702. The first and second proximity sensors may be selected from a plurality of proximity sensors 120 of the computing device 1100 by the application 610. In some implementations, the sensors may be selected based on an orientation of the computing device 1100 so that the selected proximity sensors 120 are the closest or most accessible proximity sensors 120 given the orientation. Alternatively, the proximity sensors 120 may be selected by a user, or may be selected based on configuration information associated with the application 610.

A first value is received from the first proximity sensor at 704. The first value may be received by the application 610 through the proximity sensor API 605. The first value may represent a first distance between a first object and the first proximity sensor. The first object may be a finger or hand of a user of the computing device 1100. Alternatively or additionally, the first value may be a velocity of the first object as it moves towards the first proximity sensor.

A second value is received from the second proximity sensor at 706. The second value may be received by the application 610 through the proximity sensor API 605. The second value may represent a second distance between a second object and the second proximity sensor. The second proximity sensor may be a different proximity sensor than the first proximity sensor.

Depending on the implementation, a third value is optionally received from a sensor other than the first and the second proximity sensors at 708. The third sensor may not be a proximity sensor. The third value may be other sensor data 615 and may be received by the application 610 from a sensor such as an accelerometer, global positioning system, a gyroscope, or a capacitive display. Other sensors may be used.

One or more operations are performed based on both the first value and the second value at 710. The one of more operation may be performed by the application 610. Where the application is a videogame application, the operations may include performing one or more character actions with a force or velocity proportional to the first value and the second value. Other operations may be supported. Where the third value is received, the operation may be performed using the first, second, and third values.

Figure 8:
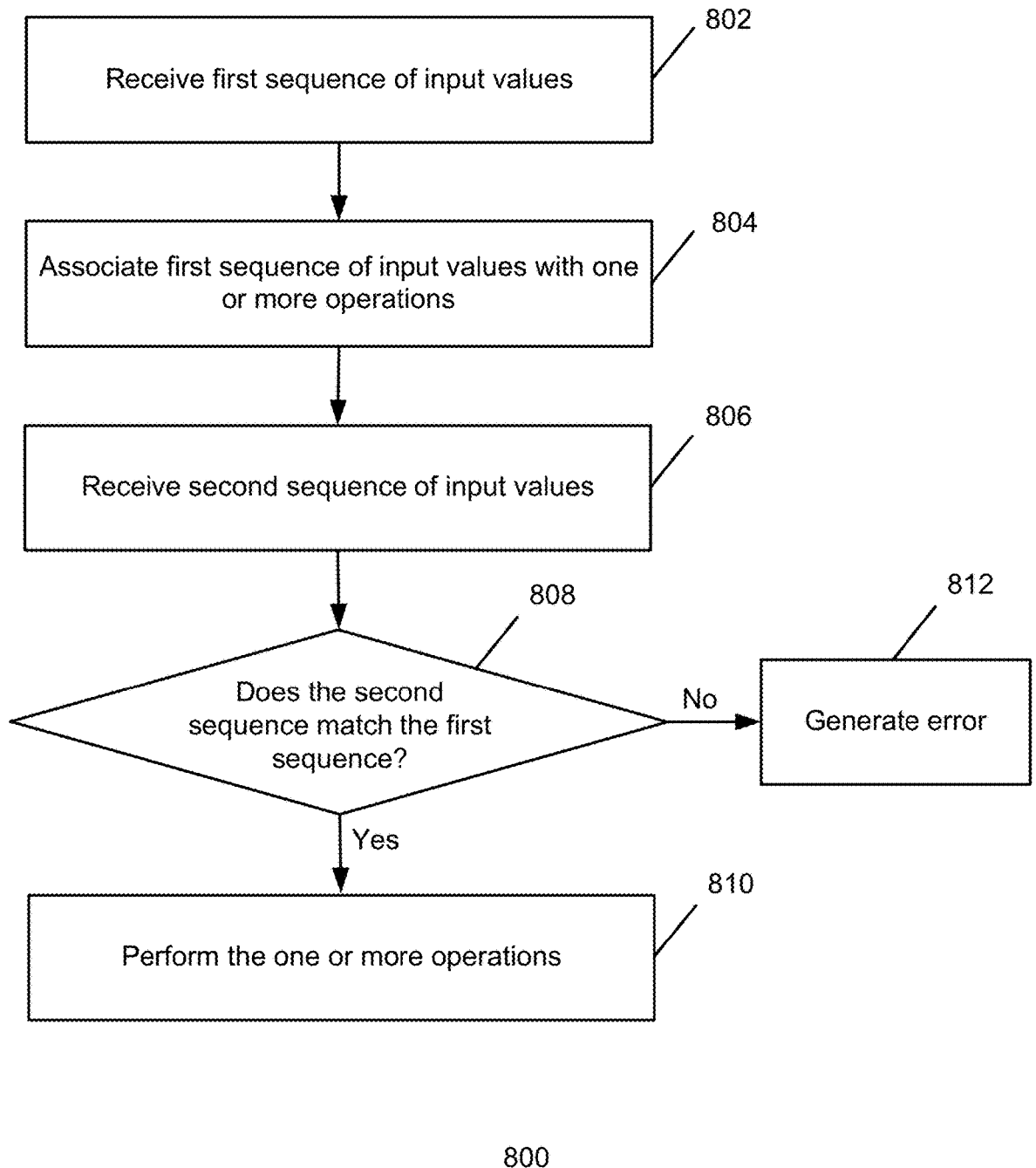
FIG. 8 is an illustration of an implementation of an exemplary method for performing one or more operations based on input value sequences.

FIG. 8 is an illustration of an implementation of an exemplary method 800 for performing one or more operations based on input value sequences. The method 800 may be implemented by the input sequence engine 620 of the environment 600, for example.

A first sequence of input values is received at 802. The first sequence of input values may be received by the input sequence engine 620 from a first proximity sensor 120 and a second proximity sensor 120. Each input value in the first sequence of input values may represent either a distance between a first object and the first proximity sensor 120 or a distance between a second object and the second proximity sensor.

The first sequence of input values is associated with one or more operations at 804. The first sequence of input values may be associated with one or more operations by the input sequence engine 620. The one or more operations may include opening a contact, sending a message to a contact, calling a contact, unlocking the computed device, turning on the computing device, turning off the computing device, opening an application, turning or turning of Wi-Fi, and putting the computing device in airplane mode, for example. The one or more operations may be selected by a user or administrator, depending on the implementation. For example, after entering the first sequence of input values, the user may select the desired one or more operations from a drop down menu or other user interface element. The first sequence of input values and the associated one or more operations may be stored in the input sequence storage 625.

A second sequence of input values is received at 806. The second sequence of input values may be received by the input sequence engine 620 from the first proximity sensor 120 and the second proximity sensor 120.

A determination of whether the second sequence matches the first input sequence is made at 808. The determination may be made by the input sequence engine 620. If the first sequence matches the second sequence, then the method 800 may continue at 810. Otherwise, the method 800 may continue at 812.

The one or more operations are performed at 810. The one or more operations associated with the first input sequence may be retrieved from the input sequence storage 625 and performed by the input sequence engine 620.

An error is generated at 812. If the first input sequence does not match the second input sequence, then an error may be generated by the input sequence engine 620 and the one or more operations associated first input sequence are not performed. For example, a message that the input sequence was not recognized may be displayed to the user, or a sound associated with an error may be played. Alternatively, the one or more operations associated first input sequence is not performed and no error message or sound may be generated.

Figure 9:
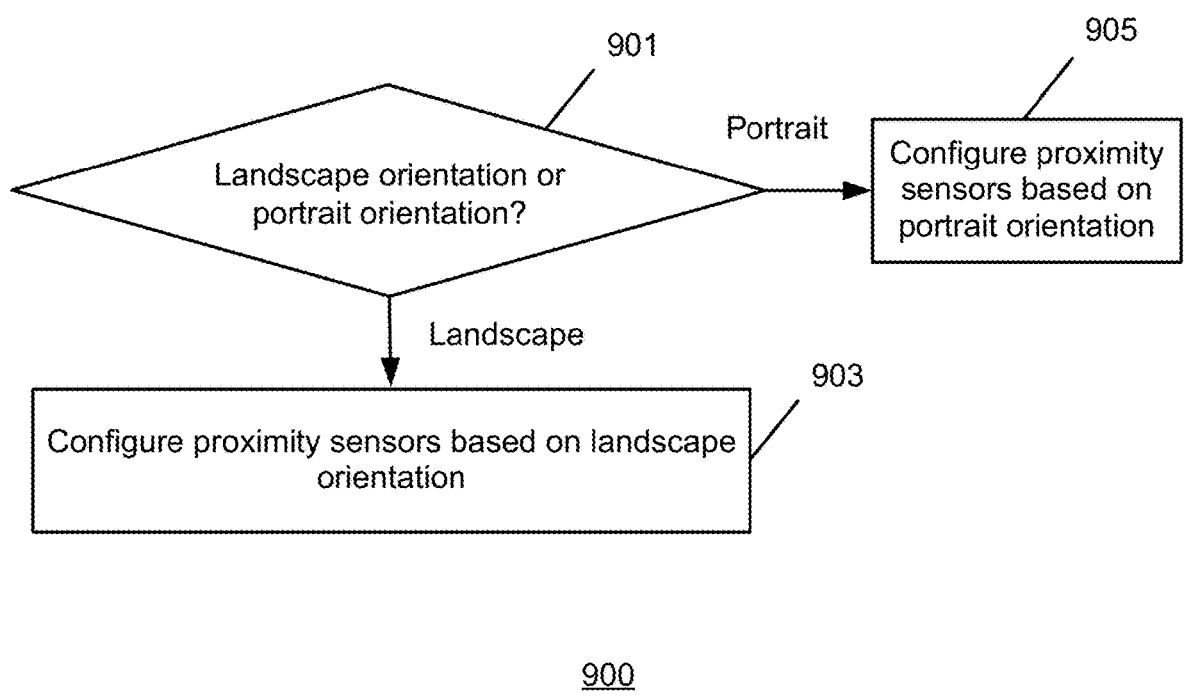
FIG. 9 is an illustration of an implementation of an exemplary method for configuring one or more proximity sensors based on orientation information.

FIG. 9 is an illustration of an implementation of an exemplary method 900 for configuring one or more proximity sensors based on orientation information. The method 900 may be implemented by the application 610 of the environment 600, for example.

A determination of whether a computing device is in a landscape orientation or a portrait orientation is made at 901. The determination may be made by the application 610 using sensor data provided by the accelerometer or gyroscope, for example. Other methods or techniques for determining an orientation of a computing device may be used. If the computing device is determined to be in a landscape orientation, then the method 900 may continue at 903. If the computing device is determined to be in a portrait orientation, then the method 900 may continue at 905.

The proximity sensors are configured based on a landscape orientation at 903. The proximity sensors 120 may be configured by the application 610. In some implementations, in the landscape orientation the proximity sensors 120 that are well suited for the landscape orientation may be selected for use by the application 610. Thus, looking at the computing device 500 of FIG. 5, either the proximity sensors 120a and 120b, or the proximity sensors 120c and 120d may be selected and activated.

The proximity sensors are configured based on a portrait orientation at 905. The proximity sensors 120 may be configured by the application 610. In some implementations, in the portrait orientation the proximity sensors 120 that are well suited for the portrait orientation may be selected for use by the application 610. Thus, continuing to look at the computing device 500 of FIG. 5, either the proximity sensors 120a and 120d, or the proximity sensors 120b and 120c may be selected and activated.

Figure 10:
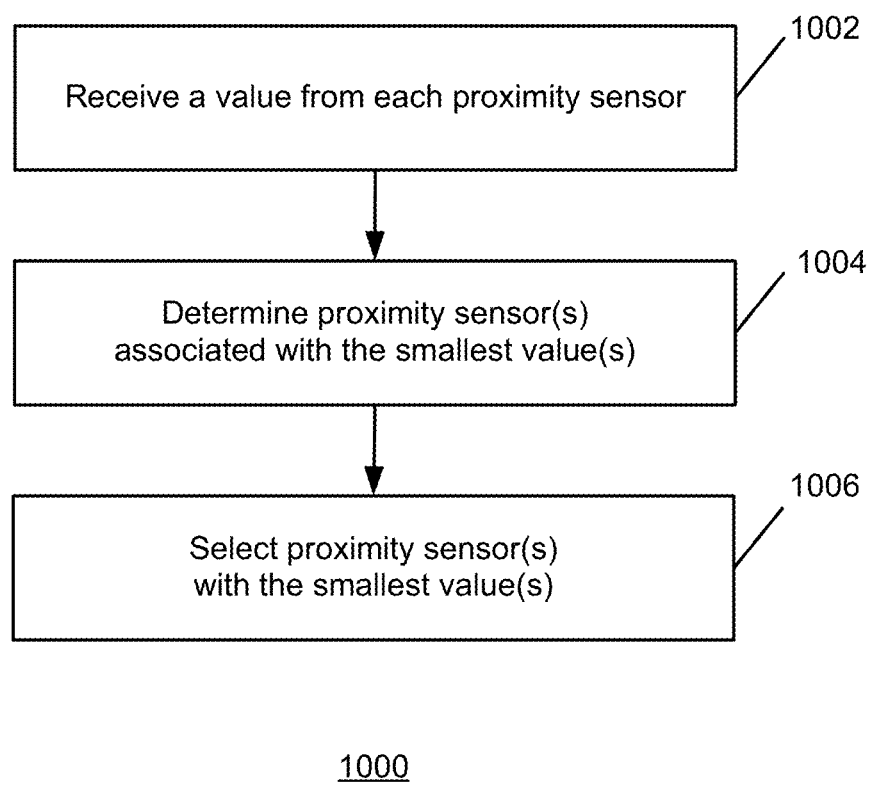
FIG. 10 is an illustration of an implementation of an exemplary method for configuring one or more proximity sensors based on determined values.

FIG. 10 is an illustration of an implementation of an exemplary method 1000 for configuring one or more proximity sensors based on determined values. The method 1000 may be implemented by the application 610 of the environment 600, for example.

A value is received from each proximity sensor at 1002. The values may be received by the application 610 from each of the proximity sensors 120 through the proximity sensor API 605. Each value may represent the distance between a proximity sensor 120 and the closest object.

Proximity sensor(s) associated with the smallest received value(s) are determined at 1004. The smallest received values may be determined by the application 610. As part of the proximity sensor 120 configuration process a user may have been prompted to select one or more proximity sensors 120 to use during the application 610. In some implementations, the application 610 may have prompted the user to select the proximity sensors 120 by placing his finger or another object close to or in front of the sensors 120 that he would like to select. Thus, the proximity sensors 120 with the smallest values may be the proximity sensors 120 that were selected by the user.

The proximity sensor(s) with the smallest received value(s) are selected at 1006. The proximity sensors 120 may be selected by the application 610 and may be used to provide input to the application 610 by the user. Any non-selected proximity sensors 120 may be deactivated, for example.

Figure 11:
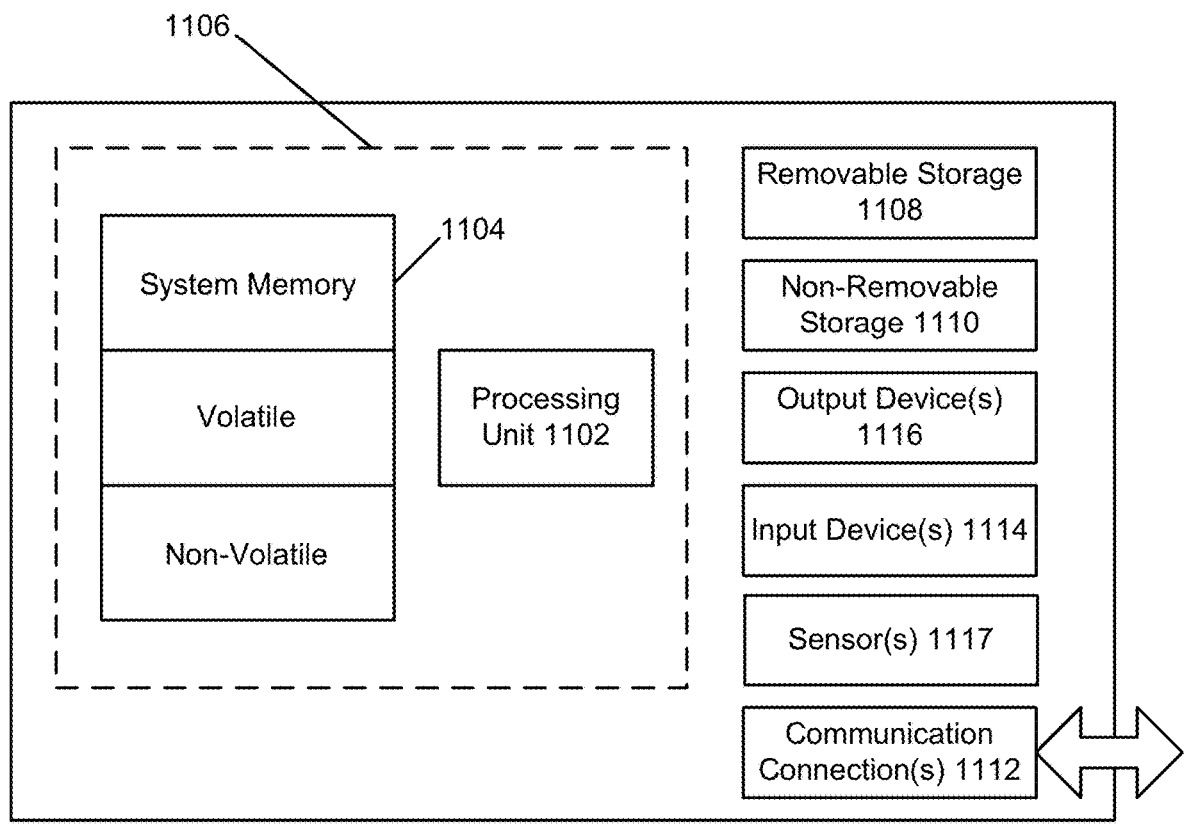
FIG. 11 is an illustration of an exemplary computing environment in which example embodiments and aspects may be implemented.

FIG. 11 shows an exemplary computing environment in which example embodiments and aspects may be implemented. The computing system environment is only one example of a suitable computing environment and is not intended to suggest any limitation as to the scope of use or functionality.

Numerous other general purpose or special purpose computing system environments or configurations may be used. Examples of well known computing systems, environments, and/or configurations that may be suitable for use include, but are not limited to, personal computers (PCs), server computers, handheld or laptop devices, multiprocessor systems, microprocessor-based systems, network PCs, minicomputers, mainframe computers, embedded systems, distributed computing environments that include any of the above systems or devices, and the like.

Computer-executable instructions, such as program modules, being executed by a computer may be used. Generally, program modules include routines, programs, objects, components, data structures, etc. that perform particular tasks or implement particular abstract data types. Distributed computing environments may be used where tasks are performed by remote processing devices that are linked through a communications network or other data transmission medium. In a distributed computing environment, program modules and other data may be located in both local and remote computer storage media including memory storage devices.

With reference to FIG. 11, an exemplary system for implementing aspects described herein includes a computing device, such as computing device 1100. Computing device 1100 depicts the components of a basic computer system providing the execution platform for certain software-based functionality in accordance with various embodiments. Computing device 1100 can be an environment upon which a client side library, cluster wide service, and/or distributed execution engine (or their components) from various embodiments is instantiated. Computing device 1100 can include, for example, a desktop computer system, laptop computer system or server computer system. Similarly, computing device 1100 can be implemented as a handheld device (e.g., cellphone, smart phone, tablet etc.). Computing device 1100 typically includes at least some form of computer readable media. Computer readable media can be a number of different types of available media that can be accessed by computing device 1100 and can include, but is not limited to, computer storage media.

In its most basic configuration, computing device 1100 typically includes at least one processing unit 1102 and memory 1104. Depending on the exact configuration and type of computing device, memory 1104 may be volatile (such as random access memory (RAM)), non-volatile (such as read-only memory (ROM), flash memory, etc.), or some combination of the two. This most basic configuration is illustrated in FIG. 11 by dashed line 1106.

Computing device 1100 may have additional features/functionality. For example, computing device 1100 may include additional storage (removable and/or non-removable) including, but not limited to, hard disks, and SD cards. Such additional storage is illustrated in FIG. 11 by removable storage 1108 and non-removable storage 1110.

Computing device 1100 typically includes a variety of computer readable media. Computer readable media can be any available media that can be accessed by device 1100 and includes both volatile and non-volatile media, removable and non-removable media.

Computer storage media include volatile and non-volatile, and removable and non-removable media implemented in any method or technology for storage of information such as computer readable instructions, data structures, program modules or other data. Memory 1104, removable storage 1108, and non-removable storage 1110 are all examples of computer storage media. Computer storage media include, but are not limited to, RAM, ROM, electrically erasable program read-only memory (EEPROM), flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device 1100. Any such computer storage media may be part of computing device 1100.

Computing device 1100 may contain communications connection(s) 1112 that allow the device to communicate with other devices and/or networks. The connections 1112 may include Wi-Fi, cellular, Bluetooth, CDMA, GSM, etc. Computing device 1100 may also have input device(s) 1114 such as a keyboard, capacitive display, pen, voice input device, touch input device, etc. Output device(s) 1116 such as a capacitive display, speakers, etc. may also be included. Computing device 1100 may also receive data from one or more sensors 1117. The sensor(s) 1117 such accelerometers, global positioning systems, proximity sensors, gyroscopes, etc. All these devices and sensors are well known in the art and need not be discussed at length here.

It should be understood that the various techniques described herein may be implemented in connection with hardware or software or, where appropriate, with a combination of both. Thus, the methods and apparatus of the presently disclosed subject matter, or certain aspects or portions thereof, may take the form of program code (i.e., instructions) embodied in tangible media, such as floppy diskettes, CD-ROMs, hard drives, or any other machine-readable storage medium where, when the program code is loaded into and executed by a machine, such as a computer, the machine becomes an apparatus for practicing the presently disclosed subject matter.

Although exemplary implementations may refer to utilizing aspects of the presently disclosed subject matter in the context of one or more stand-alone computer systems, the subject matter is not so limited, but rather may be implemented in connection with any computing environment, such as a network or distributed computing environment. Still further, aspects of the presently disclosed subject matter may be implemented in or across a plurality of processing chips or devices, and storage may similarly be effected across a plurality of devices. Such devices might include personal computers, network servers, and handheld devices, for example.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A method comprising:
receiving a first sequence of proximity measurements from a first proximity sensor and a second proximity sensor by a computing device, the first sequence including proximity measurements collected by the first proximity sensor and proximity measurements collected by a second proximity sensor, each value in the first sequence being either a distance between a first object and the first proximity sensor or a distance between a second object and the second proximity sensor;
receiving a second sequence of proximity measurements from the first proximity sensor and the second proximity sensor by the computing device;
comparing the proximity measurements of the first sequence to the proximity measurements of the second sequence;
determining that the second sequence matches the first sequence by the computing device; and
in response to the determination, performing one or more operations associated with the first sequence by the computing device.

2. The method of claim 1, wherein the one or more operations comprise one or more of opening a contact, sending a message to a contact, calling a contact, unlocking the computing device, turning on the computing device, turning off the computing device, opening an application, and putting the computing device in airplane mode.

3. The method of claim 1, further comprising associating the first sequence with the one or more operations by the computing device.

4. The method of claim 1, further comprising receiving a selection of the one or more operations from a user.

5. The method of claim 1, further comprising determining a velocity based on the distance.

6. The method of claim 1, further comprising limiting the number of proximity measurements in the first sequence and in the second sequence to a number of distance changes or a length of time.

7. The method of claim 1, further comprising recording a sequence of distance changes.

8. The method of claim 1, further comprising recording a sequence of velocity changes.

9. A system comprising:
at least one computing device that comprises a first proximity sensor and a second proximity sensor; and
a processor adapted to:
receive a first sequence of proximity measurements from the first proximity sensor and the second proximity sensor, wherein the first sequence includes proximity measurements collected by a first proximity sensor and proximity measurements collected by a second proximity sensor, each value in the first sequence being either a distance between a first object and the first proximity sensor or a distance between a second object and the second proximity sensor;
receive a second sequence of proximity measurements from the first proximity sensor and the second proximity sensor;
compare the proximity measurements of the first sequence to the proximity measurements of the second sequence;
determine that the second sequence matches the first sequence; and
in response to the determination, perform one or more operations associated with the first sequence.

10. The system of claim 9, wherein the processor is further adapted to associate the first sequence with the one or more operations by the computing device.

11. The system of claim 9, wherein the processor is further adapted to receive a selection of the one or more operations from a user.

12. A method comprising:
receiving, at a computing device, a first sequence of proximity measurements from a first proximity sensor and a second proximity sensor of the computing device, the first sequence including proximity measurements collected by a first proximity sensor and proximity measurements collected by a second proximity sensor, each value in the first sequence being either a distance between a first object and the first proximity sensor or a distance between a second object and the second proximity sensor;
receiving, at the computing device, a second sequence of proximity measurements from the first proximity sensor and the second proximity sensor;
comparing the proximity measurements of the first sequence to the proximity measurements of the second sequence;
performing an operation, by the computing device, when the second sequence of proximity measurements matches the first sequence of proximity measurements,
wherein each input value in the first sequence of proximity measurements represents either a distance or a velocity between a first object and the first proximity sensor or between a second object and the second proximity sensor.

13. The method of claim 12, further comprising limiting the number of proximity measurements in the first sequence and in the second sequence to a number of distance changes or a length of time.

14. The method of claim 12, further comprising associating the first sequence with a plurality of operations by the computing device, wherein the operation is comprised within the plurality of operations.

15. The method of claim 1, wherein the first sequence of proximity measurements and the second sequence of proximity measurements are each received from a user and wherein the method further comprises associating the first sequence of proximity measurements with the one or more operations responsive to a receipt of a user instruction identifying the one or more operations.

* * * * *